United States Patent
Jo et al.

(10) Patent No.: US 7,799,488 B2
(45) Date of Patent: Sep. 21, 2010

(54) METHOD FOR MANUFACTURING PHASE SHIFT MASK USING ELECTRON BEAM LITHOGRAPHY

(75) Inventors: Sang Jin Jo, Cheongju-si (KR); Ho Yong Jung, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 454 days.

(21) Appl. No.: 11/965,371

(22) Filed: Dec. 27, 2007

(65) Prior Publication Data

US 2008/0182182 A1 Jul. 31, 2008

(30) Foreign Application Priority Data

Jan. 31, 2007 (KR) ...................... 10-2007-0010114

(51) Int. Cl.
*G03F 1/00* (2006.01)
(52) U.S. Cl. .......................................................... 430/5
(58) Field of Classification Search ....................... 430/5
See application file for complete search history.

(56) References Cited

U.S. PATENT DOCUMENTS

| 4,698,236 | A | * | 10/1987 | Kellogg et al. ................. 430/5 |
| 5,256,454 | A | * | 10/1993 | Murai et al. ................. 427/496 |
| 5,275,895 | A | | 1/1994 | Kusunose ..................... 430/5 |
| 5,561,030 | A | | 10/1996 | Holdcroft et al. ........... 430/311 |
| 6,287,699 | B1 | * | 9/2001 | Yasuda et al. ................... 430/5 |

FOREIGN PATENT DOCUMENTS

| KR | 10-1999-0005818 | 1/1999 |
| KR | 10-2004-0089392 | 10/2004 |
| KR | 10-0785035 | 12/2007 |

OTHER PUBLICATIONS

Amirov et al., "Etching of Silicon and Silicon Dioxide in Dense Low-Pressure Inductively Coupled Radiofrequency Discharge Fluorocarbon Plasmas," *High Energy Chemistry*, 37(5): 328-332 (2003).
Horioka et al., "Highly Selective and Directional Etching of Phosphorous. Doped Polycrystalline Silicon with Tri-Level Resist Mask Employing Magnetron Plasma," *Digest of Technical Papers-Symposium of VLSI Technology*, 81-82 (1988).

* cited by examiner

*Primary Examiner*—Mark F Huff
*Assistant Examiner*—John Ruggles
(74) *Attorney, Agent, or Firm*—Marshall, Gerstein & Borun LLP

(57) ABSTRACT

Disclosed herein is a method for manufacturing a phase shift mask. An embodiment of the disclosed method includes forming a conductive layer on a mask substrate, irradiating a predetermined area of the mask substrate on which the conductive layer is formed with an electron beam to selectively reduce a portion of silicon oxide ($SiO_2$) in the substrate to silicon (Si), etching only the predetermined area converted to Si, and removing the conductive layer to form the phase shift mask.

5 Claims, 2 Drawing Sheets

METHOD FOR MANUFACTURING PHASE SHIFT MASK USING ELECTRON BEAM LITHOGRAPHY

CROSS REFERENCE TO RELATED APPLICATION

The priority of Korean patent application No. 10-2007-0010114 filed on Jan. 31, 2007, the disclosure of which is incorporated by reference in its entirety, is claimed.

BACKGROUND OF THE INVENTION

1. Field of the Disclosure

The present invention generally relates to a method for manufacturing a photomask and, more particularly, to a method for manufacturing a phase shift mask using electron beam lithography.

2. Brief Description of Related Technology

As semiconductor devices have become more highly integrated, the size of patterns formed on semiconductor substrates has been gradually reduced. Further, as semiconductor devices have a tendency toward high integration and high density, various methods have been developed to form fine patterns. From among the methods, a pattern-forming method using a patterned phase shift mask (including a phase shifter) has been used to increase resolution.

A phase shift mask exposes a pattern having a predetermined size by using interference or partial interference of light to increase resolution or a depth of focus. That is, a difference in the phase of the light occurs, according to the existence of a shifter, when light passes through a mask substrate. The light having passed through the shifter is out of phase with the light having passed through a non-shift area of the substrate. Because the light having passed through only a transmitting part is out of phase with that of the light having passed through the shifter, the shifter is located at the edge of the mask pattern, so that the intensity of the light is offset at the boundary of the patterns and, thus, the resolution is improved.

For example, such a phase shift mask includes an alternating phase shift mask. The alternating phase shift mask has a phase shift pattern, which is formed by etching a transparent substrate by a predetermined depth, to shift the phase of the light transmitted through the transparent substrate. To manufacture the alternating phase shift mask, a quartz substrate is coated with an opaque layer, which layer functions as a mask and resist. The coated substrate is subjected to exposure and development processes using an electron beam to form a resist pattern. Thereafter, the opaque layer is etched by using the resist pattern as an etching mask, and the substrate is etched to a predetermined depth, using the etched opaque layer as an etching mask, to form a phase shift pattern.

However, according to the conventional method for manufacturing the phase shift mask as described above, the manufacturing process is complicated and lengthy. In particular, the substrate must be etched to a predetermined depth to form the phase shift pattern. However, it is difficult to precisely etch the substrate to a desired depth and width.

SUMMARY OF THE INVENTION

Disclosed herein is a method of making a phase shift mask. According to one embodiment, the method includes forming a conductive layer on a mask substrate, and reducing a predetermined area of the mask substrate, on which the conductive layer is formed. The method also includes etching the predetermined area, and removing the conductive layer to form the phase shift mask.

Additional features of the invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1:
FIGS. 1, 2, and 3 are sectional views generally of a transparent substrate sequentially illustrating a method for manufacturing a phase shift mask thereon, according to the present invention.

While the disclosed method is susceptible of embodiments in various forms, there are illustrated in the drawing (and will hereafter be described) specific embodiments, with the understanding that the disclosure is intended to be illustrative, and is not intended to limit the invention to the specific embodiments described and illustrated herein.

DETAILED DESCRIPTION OF THE PREFERRED EMBODIMENTS

Disclosed herein is a method of making a phase shift mask. According to one embodiment, the method includes forming a conductive layer on a mask substrate, and irradiating a predetermined area of the mask substrate, on which the conductive layer is formed, with an electron beam. The method also includes etching the predetermined area, and removing the conductive layer to form the phase shift mask. According to another embodiment, the method includes forming a conductive layer on a quartz substrate, and reducing a predetermined area of the substrate, on which the conductive layer is formed, into silicon. The method also includes etching the reduced, predetermined area of the substrate, and removing the conductive layer. In a preferred embodiment, the reducing step includes irradiating the predetermined area with an electron beam.

Quartz, which is material of a photomask substrate, is a silicon oxide $SiO_2$, and the reduction reactions thereof are as follows.

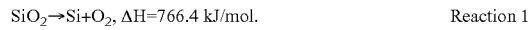
$SiO_2 \rightarrow Si + O_2$, $\Delta H = 766.4$ kJ/mol.        Reaction 1

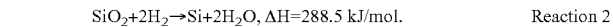
$SiO_2 + 2H_2 \rightarrow Si + 2H_2O$, $\Delta H = 288.5$ kJ/mol.        Reaction 2

Because the enthalpy of reaction (reduction) for both reactions is positive, the reactions are considered endothermic. That is, a sufficient energy must be supplied to activate (and carry out) the reaction. Further, because the bonding energy of Si—O is 452 kilojoules per mole (kJ/mol), energy of 904 kJ/mol is necessary to break the Si—O bonds in one mole of silicon oxide ($SiO_2$). Converting this energy into units of electron-volts (eV), energy of about 18 eV and 13 eV or more is necessary to reduce one mole of silicon oxide in Reactions 1 and 2, respectively.

Energy necessary to reduce silicon oxide to silicon can be supplied using commercially-available electron beam lithography equipment, which can output a maximum energy of 50 KeV. Further, because an electron beam can have a maximum spot size of 1 nanometer (nm), ultra-micro size patterns can be formed using the electron beam.

Referring now to the drawing figures wherein like reference numbers represent the same or similar elements in the various figures, FIG. 1 illustrates a method of making a phase shift mask. In FIG. 1, a conductive polymer material layer 102 having a predetermined thickness is coated on a transparent substrate 100, such as a quartz substrate. The conductive polymer material layer 102 disperses charges generated by the electron beam. The conductive polymer material layer 102 must be sufficiently thin to enable the electron beam to reach the substrate 100. The conductive polymer material layer 102 preferably includes a polymer selected from the group consisting of polyacetylene, polyaniline, poly(p-phenylene), polypyrrole, polythiophene, (p-phenylene vinylene), polyethylenedioxythiophene, polythienylene vinylene, and mixtures thereof.

Figure 2:
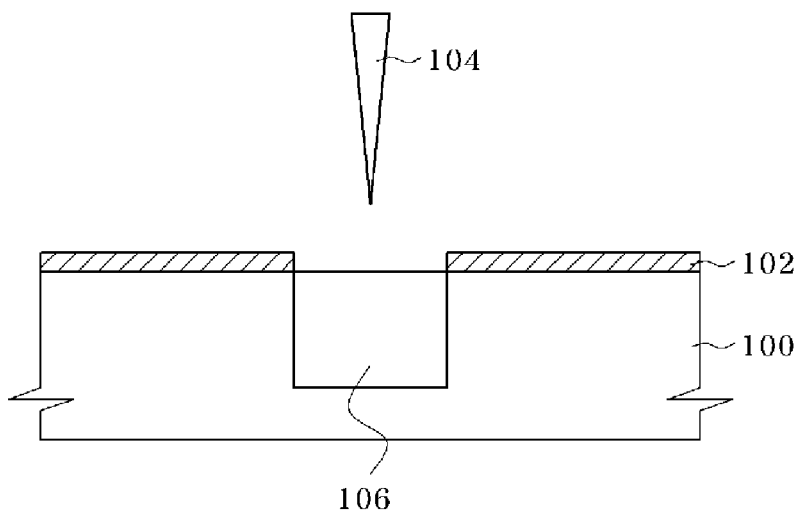

Referring to FIG. 2, the silicon oxide ($SiO_2$) on a (predetermined) desired area is reduced to silicon (Si) by using electron beam lithography. More specifically, an electron beam 104 having predetermined energy is irradiated onto an area of the substrate 100 on which a phase shift pattern is to be formed.

As the electron beam 104 is irradiated, the conductive polymer material layer 102 disperses the charges of the electron beam 104 into the substrate 100. The area 106 on the substrate 100, onto which the electron beam 104 is irradiated, is reduced into silicon by the energy of the electron beam 104. As described above, the maximum output energy of commercially-available electron beam lithography equipment is 50 keV, which is suitable for reducing the silicon oxide ($SiO_2$) into silicon (Si). Accordingly, the silicon oxide ($SiO_2$), which corresponds to the area 106 where the electron beam is irradiated, is reduced to silicon (Si).

Figure 3:
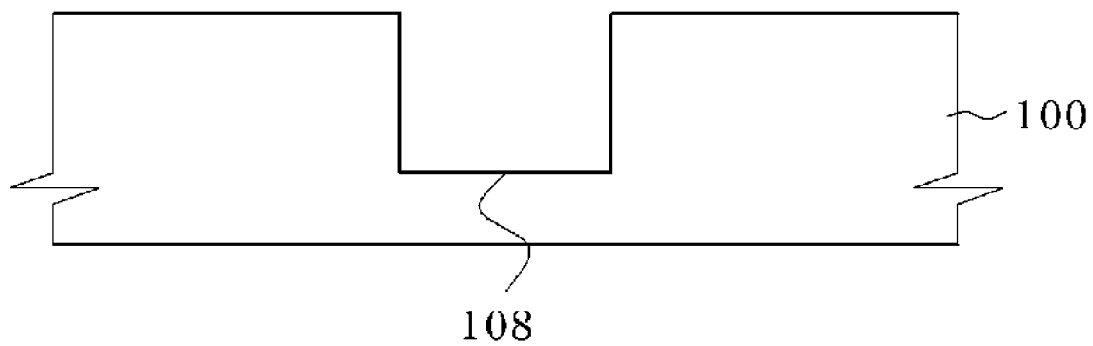

Referring to FIG. 3, the area 106 reduced into silicon (Si) is selectively etched. preferably with a silicon etchant. Preferably the area 106 is dry etched. Thereafter, the remaining, unnecessary conductive polymer material layer is removed to complete the manufacture of a phase shift mask having a phase shift pattern 108.

As described above, the area of the substrate, on which the phase shift pattern is to be formed using the electron beam lithography, is reduced into silicon (Si), and then only the silicon region is selectively removed, so that the alternating phase shift mask can be manufactured without etching the $SiO_2$ portion of the substrate.

According to the disclosed method, a phase shift pattern can be easily formed through a simplified process. Further, the substrate area, on which the phase shift pattern is formed, is reduced and then etched, so that an etch selectivity can be ensured and the manufacturing process can be simplified. Furthermore, because the methods employ an electron beam, ultra-micro sized patterns can be formed. Moreover, the etching process can be performed directly after the electron beam lithography process, so that the CD (critical dimension) of the pattern does not change during other processes and the precision of the CD of the pattern can be improved.

The embodiments of the present invention have been described for illustrative purposes. Those skilled in the art will appreciate that various modifications, additions and substitutions are possible, without departing from the scope and spirit of the invention as recited in the accompanying claims.

What is claimed is:

1. A method for manufacturing a phase shift mask, the method comprising:
    (a) forming a conductive layer on a mask substrate of silicon oxide ($SiO_2$); (b) reducing a predetermined area of the mask substrate $SiO_2$, on which the conductive layer is formed, into silicon (Si) by irradiating the predetermined area with an electron beam through the conductive layer;
    (c) etching the predetermined area to remove the Si and form a phase shift pattern in the mask substrate; and
    (d) removing the conductive layer.

2. The method of claim 1, wherein the conductive layer comprises a conductive polymer layer.

3. The method of claim 2, wherein the conductive polymer layer comprises a polymer selected from the group consisting of polyacetylene, polyaniline, poly(p-phenylene), polypyrrole, polythiophene, (p-phenylene vinylene), polyethylenedioxythiophene, polythienylene vinylene, and mixtures thereof.

4. The method of claim 1 further comprises etching the predetermined area with a silicon etchant.

5. The method of claim 1, wherein the etching step (c) comprises performing a dry etching process.

* * * * *